(12) United States Patent
Kim et al.

(10) Patent No.: US 10,043,562 B2
(45) Date of Patent: Aug. 7, 2018

(54) ELECTRONIC DEVICE

(71) Applicant: SK hynix Inc., Icheon-Si (KR)

(72) Inventors: June-Seo Kim, Icheon-si (KR);
Min-Suk Lee, Seongnam-si (KR);
Jung-Hwan Moon, Icheon-si (KR);
Bo-Kyung Jung, Cheongju-si (KR);
Jeong-Myeong Kim, Hwaseong-si (KR); Ji-Hun Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/494,314

(22) Filed: Apr. 21, 2017

(65) Prior Publication Data

US 2018/0102154 A1 Apr. 12, 2018

(30) Foreign Application Priority Data

Oct. 11, 2016 (KR) .................. 10-2016-0131052

(51) Int. Cl.
| | |
|---|---|
| *H01L 29/82* | (2006.01) |
| *G11C 11/16* | (2006.01) |
| *H01L 43/08* | (2006.01) |
| *H01L 43/02* | (2006.01) |
| *H01L 27/22* | (2006.01) |

(52) U.S. Cl.
CPC ........ *G11C 11/161* (2013.01); *G11C 11/1675* (2013.01); *H01L 27/228* (2013.01); *H01L 43/02* (2013.01); *H01L 43/08* (2013.01)

(58) Field of Classification Search
CPC . G11C 11/161; G11C 11/1675; H01L 27/228; H01L 43/02; H01L 43/08
See application file for complete search history.

(56) References Cited

U.S. PATENT DOCUMENTS

| | | | |
|---|---|---|---|
| 8,269,319 B2 | 9/2012 | Honer et al. | |
| 2014/0204662 A1* | 7/2014 | Zhou | G11C 11/5607 365/158 |
| 2015/0008548 A1* | 1/2015 | Noma | H01L 43/02 257/421 |
| 2016/0284761 A1* | 9/2016 | Zhou | H01L 43/02 |

FOREIGN PATENT DOCUMENTS

KR    10-2015-0130660    11/2015

* cited by examiner

*Primary Examiner* — Sitaramarao S Yechuri
(74) *Attorney, Agent, or Firm* — Perkins Coie LLP

(57) ABSTRACT

In one implementation, an electronic device is provided to include a semiconductor memory, wherein the semiconductor memory may include: a variable resistance element including a Magnetic Tunnel Junction (MTJ) structure including a free layer having a changeable magnetization direction free layer, a pinned layer having a fixed magnetization direction and a tunnel barrier layer interposed between the free layer and the pinned layer, and the electronic device may further include, in a first direction in which the free layer, the tunnel barrier layer and the pinned layer are arranged, a first permanent magnet having a first surface facing a first surface of the variable resistance element and spaced from the variable resistance element, wherein a magnetic field generated by the first permanent magnet may have a direction which offsets or reduces an influence of a stray field generated by the pinned layer.

25 Claims, 10 Drawing Sheets

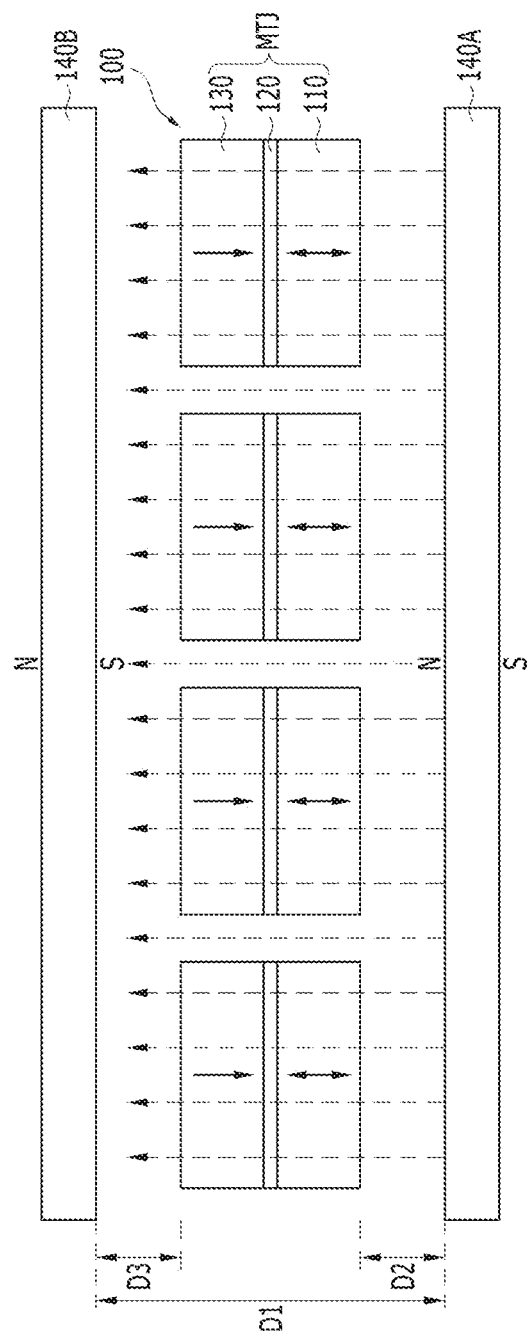

ELECTRONIC DEVICE

CROSS-REFERENCE TO RELATED APPLICATIONS

This patent document claims priority of Korean Patent Application No. 10-2016-0131052, entitled "ELECTRONIC DEVICE" and filed on Oct. 11, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory or a semiconductor chip package which can improve characteristics and fabricating processes of a variable resistance element.

In an implementation, an electronic device includes a semiconductor memory, wherein the semiconductor memory may include: a variable resistance element including a Magnetic Tunnel Junction (MTJ) structure including a free layer having a changeable magnetization direction free layer, a pinned layer having a fixed magnetization direction and a tunnel barrier layer interposed between the free layer and the pinned layer, and the electronic device may further include, in a first direction in which the free layer, the tunnel barrier layer and the pinned layer are arranged, a first permanent magnet having a first surface facing a first surface of the variable resistance element and spaced from the variable resistance element, wherein a magnetic field generated by the first permanent magnet may have a direction which offsets or reduces an influence of a stray field generated by the pinned layer.

Implementations of the above device may include one or more the following.

On an axis passing through the variable resistance element in the first direction, a direction of a magnetic field generated by the first permanent magnet may be opposite to a magnetization direction of the pinned layer. When a magnetization direction of the pinned layer directs from a second surface opposite to the first surface of the variable resistance element to the first surface of the variable resistance element, the first surface of the first permanent magnet may have a north-seeking pole. If a distance between the variable resistance element and the first permanent magnet is decreased to a predetermined critical value, a reset operation in which the variable resistance element is changed into a high resistance state may be performed. The electronic device may further include an insulating material interposed between the variable resistance element and the first permanent magnet and having elasticity. When pressure in a direction from a second surface opposite to the first surface of the first permanent magnet to the first surface of the first permanent magnet is applied to the second surface, the insulating material may contract so that the reset operation is performed. The electronic device may further include a second permanent magnet having a first surface facing a second surface opposite to the first surface of the variable resistance element in the first direction and spaced from the variable resistance element, and a magnetic field generated by the second permanent magnet may have a direction which offsets or reduces an influence of a stray field generated by the pinned layer. On an axis passing through the variable resistance element in the first direction, directions of magnetic fields generated by the first and second magnets may be opposite to a magnetization direction of the pinned layer. When a magnetization direction of the pinned layer directs from a second surface opposite to the first surface to the variable resistance element to the first surface of the variable resistance element, the first surface of the first permanent magnet may have a north-seeking pole and the first surface of the second permanent magnet has a south-seeking pole. If a distance between the first permanent magnet and the second permanent magnet is decreased to a predetermined critical value, a reset operation in which the variable resistance element is changed into a high resistance state may be performed. The electronic device may further include an insulating material interposed between the variable resistance element and first permanent magnet and between the variable resistance element and the second permanent magnet and having elasticity. When pressure in a direction from a second surface opposite to the first surface of the first permanent magnet is applied to the second surface, and pressure in a direction from a second surface opposite to the first surface of the second permanent magnet to the first surface of the second permanent magnet is applied to the second surface, the insulating material may contract and the reset operation may be performed. The semiconductor memory may further include one or more additional variable resistance elements having the same structure as the variable resistance element, and the first surface of the first permanent magnet may face a first surface of the variable resistance element and a first surface of the additional variable resistance element. The semiconductor memory may further include one or more additional variable resistance elements having the same structure as the variable resistance element, the first surface of the first permanent magnet may face a first surface of the variable resistance element and a first surface of the additional variable resistance element, and the first surface of the second permanent magnet may face a second surface of the variable resistance element and a second surface of the variable resistance element.

In another implementation, an electronic device includes a semiconductor chip package, wherein the semiconductor chip package may include: a semiconductor chip having a memory cell array; and a first permanent magnet having a first surface facing a first surface of the semiconductor chip, wherein the memory cell array may include a variable resistance element including a Magnetic Tunnel Junction (MTJ) structure including a free layer having a changeable magnetization direction free layer, a pinned layer having a fixed magnetization direction and a tunnel barrier layer interposed between the free layer and the pinned layer, and the first permanent magnet generates a magnetic field having a magnetization direction to offset or reduce an influence of a stray field generated by the pinned layer.

Implementations of the above device may include one or more the following.

The first permanent magnet may be directly attached to the first surface of the semiconductor chip. The semiconductor chip package may further include a first adhesion member interposed between the semiconductor chip and the first permanent magnet. The first adhesion member may have elasticity. The semiconductor chip package may further include a molding member at least partially surrounding the semiconductor chip, and the molding member may have elasticity and be interposed between the semiconductor chip and the first permanent magnet. The magnetization direction of a magnetic field generated by the first permanent magnet may be opposite to a magnetization direction of the pinned layer. The semiconductor chip package may further include a second permanent magnet having a first surface facing a second surface opposite to the first surface of the semiconductor chip, and the second permanent magnet generates a magnetic field having a magnetization direction to offset or reduce the influence of the stray field generated by the pinned layer. The second permanent magnet may be directly attached to the second surface of the semiconductor chip. The semiconductor chip package may further include a second adhesion layer interposed between the semiconductor chip and the second permanent magnet. The second adhesion layer may have elasticity. The semiconductor chip package may further include a molding member at least surrounding the semiconductor chip, and the molding member may have elasticity and be interposed between the semiconductor chip and the first permanent magnet, and between the semiconductor chip and the second permanent magnet. The magnetization directions of magnetic fields generated by the first and second permanent magnets may be opposite to a magnetization direction of the pinned layer. The semiconductor chip package may further include an additional semiconductor chip facing a second surface opposite to the first surface of the first permanent magnet, and the additional semiconductor chip includes a pinned layer having a different magnetization direction from the magnetization direction of the magnetic field generated by the first permanent magnet.

In another implementation, an electronic device includes a semiconductor memory, wherein the semiconductor memory comprises: a variable resistance element including a Magnetic Tunnel Junction (MTJ) structure including a free layer having a changeable magnetization direction, a pinned layer having a fixed magnetization direction and a tunnel barrier layer interposed between the free layer and the pinned layer, and a permanent magnet device spaced from the variable resistance element and structured in a shape and dimension to produce a magnetic field at the free layer of the variable resistance element that offsets or reduces an influence of a stray field generated by the pinned layer.

Implementations of the above device may include one or more the following.

The permanent magnet device is structured to render the magnetization direction of the magnetic field at the free layer to be opposite to the magnetization direction of the pinned layer. The permanent magnet device is structured to produce the magnetic field at the free layer to have a spatial profile that matches the magnetic field of the pinned layer. The electronic device further includes an adjustable device that adjusts a distance between the variable resistance element and the permanent magnet device, wherein the device is operable to cause the distance to be decreased to a predetermined critical value to allow a reset operation on a resistance state of the variable resistance element by the magnetic field at the free layer of the variable resistance element produced by the permanent magnet device. The adjustable device includes an insulating material interposed between the variable resistance element and the first permanent magnet and having elasticity to allow adjustment of a thickness of the insulating material in response to an applied pressure. The adjustable device, when the applied pressure in a direction from a second surface opposite to the first surface of the first permanent magnet to the first surface of the first permanent magnet is applied to the second surface of the first permanent magnet to cause the insulating material to contract, causes the variable resistance element to be changed into a high resistance state from a low resistance state. The permanent magnet device includes a second permanent magnet having a first surface facing a second surface opposite to the first surface of the variable resistance element and spaced from the variable resistance element, wherein a magnetic field generated by the second permanent magnet has a magnetization direction to offset or reduce the influence of the stray field generated by the pinned layer. The magnetization directions of the magnetic fields generated by the first and second permanent magnets are opposite to the magnetization direction of the pinned layer. When the magnetization direction of the pinned layer directs from the second surface of the variable resistance element to the first surface of the variable resistance element, the first surface of the first permanent magnet has a north-seeking pole and the first surface of the second permanent magnet has a south-seeking pole. If a distance between the first permanent magnet and the second permanent magnet is decreased to a predetermined critical value, the variable resistance element is changed into a high resistance state from a low resistance state. The electronic device further comprises an insulating material interposed between the variable resistance element and first permanent magnet and between the variable resistance element and the second permanent magnet, the insulating material having elasticity. When pressure in a direction from a second surface opposite to the first surface of the first permanent magnet is applied to the second surface of the first permanent magnet, and pressure in a direction from a second surface opposite to the first surface of the second permanent magnet to the first surface of the second permanent magnet is applied to the second surface of the second permanent magnet, the insulating material contracts to cause the variable resistance element to be changed into a high resistance state from a low resistance state. The semiconductor memory further comprises an additional variable resistance element, and the first surface of the first permanent magnet faces both the first surface of the variable resistance element and a first surface of the additional variable resistance element. The semiconductor memory further comprises an additional variable resistance element, the first surface of the first permanent magnet faces both the first surface of the variable resistance element and a first surface of the additional variable resistance element, and the first surface of the second permanent magnet faces both the second surface of the variable resistance element and a second surface of the additional variable resistance element.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages are described in greater detail in the drawings, the description and the claims.

BRIEF DESCRIPTION OF THE DRAWINGS

FIG. 2B is a cross-sectional view describing an electronic device in accordance with another implementation of the present disclosure.

DETAILED DESCRIPTION

Figure 1:
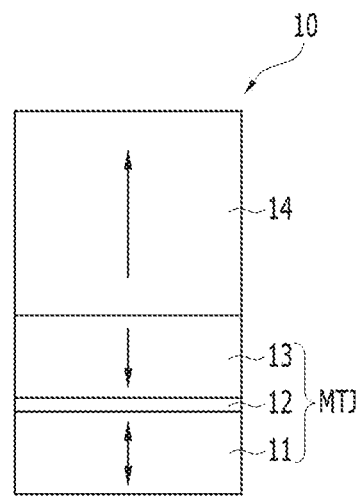
FIG. 1 is a cross-sectional view describing a comparative example of a variable resistance element.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view describing a variable resistance element that has a structure associated with a drawback as a comparison.

Referring to FIG. 1, a variable resistance element 10 includes a Magnetic Tunnel Junction (MTJ) structure including a free layer 11 having a changeable magnetization direction, a pinned layer 13 having a fixed magnetization direction and a tunnel barrier layer 12 interposed between the free layer 11 and the pinned layer 13 and allowing tunneling of electrons as necessary, and a magnetic correction layer 14 disposed over the MTJ structure and capable of offsetting or reducing an influence of a stray field generated by the pinned layer 13.

The magnetic correction layer 14 may have a magnetization direction opposite to the magnetization direction of the pinned layer 13 in order to offset or reduce the influence of the stray field generated by the pinned layer 13. For example, when the pinned layer 13 has a downward magnetization direction, the magnetic correction layer 14 may have an upward magnetization direction. If the magnetic correction layer 14 does not exist, a bias magnetic field may be generated in the free layer 11 due to the influence of the stray field generated by the pinned layer 13 so that a switching characteristic of the variable resistance element 10 may be deteriorated. Therefore, the magnetic correction layer 14 may be an indispensable constitutional element under the illustrated structure for the variable resistance element 10.

The above variable resistance element 10 may be formed by depositing material layers for forming the MTJ structure and the magnetic correction layer 14, and then etching the material layers by using one mask.

However, since the magnetic correction layer 14 generally occupies a substantial or the largest volume in the variable resistance element 10, time and cost of the deposition process for forming the magnetic correction layer 14 as part of the variable resistance element 10 may be increased due to the existence of the magnetic correction layer 14 and the presence of the magnetic correction layer 14 can also increase the difficulty in the etching process in fabrication.

Further, since the magnetic correction layer 14 has a predetermined geometric shape due to etching, it may cause a undesired leakage magnetic field at the free layer 11 and this leakage magnetic field may be non-uniform. Hence, it may be difficult for a leakage magnetic field generated by the pinned layer 13 to be exactly or effectively offset by the leakage magnetic field generated by the magnetic correction layer 14.

The disclosed technology provides implementations of an electronic device which is capable of solving the above problems. For example, the disclosed technology can be used to include a permanent magnetic device in an electronic device to provide a desired correction magnetic field to a MTJ structure of a semiconductor memory and is separated from the MTJ structure. Such a semiconductor memory can include a variable resistance element including a Magnetic Tunnel Junction (MTJ) structure including a free layer having a changeable magnetization direction, a pinned layer having a fixed magnetization direction and a tunnel barrier layer interposed between the free layer and the pinned layer. A permanent magnet device is spaced from the variable resistance element and structured in a shape and dimension to produce a magnetic field at the free layer of the variable resistance element that offsets or reduces an influence of a stray field generated by the pinned layer. In implementations, the permanent magnet device can include one permanent magnet for providing magnetic correction at one or more MTJ structures, or two or more permanent magnets for providing magnetic correction at one or more MTJ structures.

Figure 2A:
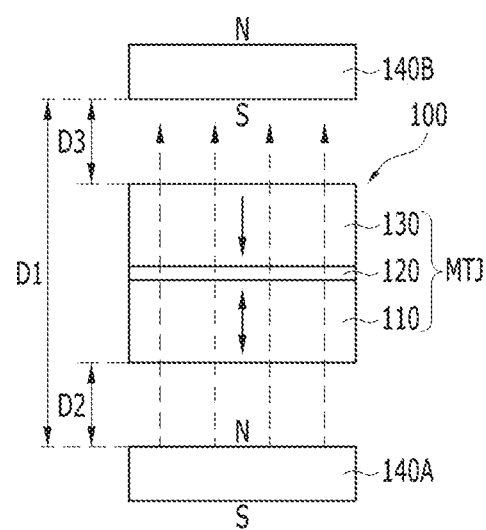
FIG. 2A is a cross-sectional view describing an electronic device in accordance with an implementation of the present disclosure.

FIG. 2A is a cross-sectional view describing an electronic device in accordance with an implementation of the present disclosure, and FIG. 2B is a cross-sectional view describing an electronic device in accordance with another implementation of the present disclosure.

First, referring to FIG. 2A, the electronic device in accordance with the implementation may include a variable resistance element 100. The variable resistance element 100 is structured to exhibit different resistance states of different resistance values for representing different data for data storage. The variable resistance element 100 may store data by switching between different resistance states and thus function as a memory cell. The variable resistance element 100 may include a Magnetic Tunnel Junction (MTJ) structure including a free layer 110, a pinned layer 130 and a tunnel barrier layer 120 interposed between the free layer 110 and the pinned layer 130.

Here, the free layer 110 may have a changeable magnetization direction so as to store data, and be referred to as a storage layer. The pinned layer 130 may have a fixed magnetization direction so as to be compared with the magnetization direction of the free layer 110, and be referred to as a reference layer. The free layer 110 and the pinned layer 130 may have a single-layer structure or a multi-layer structure that includes a ferromagnetic material. For example, the free layer 110 and the pinned layer 130 may include an alloy containing or including Fe, Ni or Co as a major component such as an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, an Fe—Pd alloy, a Co—Fe—B alloy, or others, or a stacked structure such as Co/Pt, Co/Pd, or others. The magnetization directions of the free layer 110 and the pinned layer 130 may be substantially parallel to a direction perpendicular to an interface between the layers, for example, an interface between the free layer 110 and the tunnel barrier layer 120. Hereinafter, the direction perpendicular to an interface between the layers, for example, an interface between the free layer 110 and the tunnel barrier layer 120 is referred to as a first direction. That is, the magnetization direction of the free layer 110 may be changed between a downward direction and an upward direction. The magnetization direction of the pinned layer 130 may be fixed to a downward direction or an upward direction as shown in FIG. 2A. The change of the magnetization direction of the free layer 110 may be caused by spin transfer torque. The upper and lower positions of the free layer 110 and the pinned layer 130 may be diversely changed with the tunnel barrier layer 120 therebetween. For example, contrary to this implementation, the pinned layer 130 may be disposed under the tunnel barrier layer 120, and the free layer 110 may be disposed over the tunnel barrier layer 120.

The tunnel barrier layer 120 may allow tunneling of electrons between the free layer 110 and the pinned layer 130 as necessary, for example, during a data write operation that changes the resistance state of the variable resistance. The tunnel barrier layer 120 may include insulating oxide, for example, oxide such as MgO, CaO, SrO, TiO, VO, NbO, or others.

The variable resistance element 100 may store data as the magnetization direction of the free layer 110 is changed by applying a voltage or current applied of a sufficient magnitude to the variable resistance element 100. When the magnetization directions of the free layer 110 and the pinned layer 130 are parallel to each other, the variable resistance element 100 may be in a low resistance state and, for example, store a particular designated digital data bit such as "1". Conversely, the magnetization directions of the free layer 110 and the pinned layer 130 are anti-parallel to each other, the variable resistance element 100 may be in a high resistance state and, for example, store a particular designated digital data bit such as "0". In some implementations, the variable resistance element is configured to store data bit "0" when the magnetization directions of the free layer 110 and the pinned layer 130 are parallel to each other and store data bit "1" when the magnetization directions of the free layer 110 and the pinned layer 130 are anti-parallel to each other.

Further, although they are not shown, the variable resistance element 100 may include layers for various purposes in order to improve characteristics or processes of the MTJ structure. For example, the variable resistance element 100 may include a seed layer (not shown) that is disposed under the MTJ structure and helps the free layer to grow in a desired crystal structure, a hard mask layer (not shown) that is disposed over the MTJ structure and used for patterning the variable resistance element 100, and so on.

In the present implementation, the variable resistance element 100 is provided with a magnetic correction mechanism by using permanent magnets without using a magnetic correction layer that is built into the variable resistance element 100 as shown in FIG. 1 and thus occupies the substantial or largest volume of the variable resistance element 100. As shown by a specific example in FIGS. 2A and 2B, a first permanent magnet 140A and a second permanent magnet 140B are placed at two opposite sides of the variable resistance element 100 to provide the desired magnetic correction effect of the magnetic correction layer 14 in FIG. 1. The first and second permanent magnets 140A and 140B may be separated from the variable resistance element 100 as shown in the example in FIG. 2A and may be separated from but shared by different variable resistance elements 100 as shown in the example in FIG. 2B. The first and second permanent magnets 140A and 140B may be positioned or disposed under and over the variable resistance element 100, respectively, to use produce a desired correction magnetic field at the free layer of the variable resistance element 100.

In some implementations, the first permanent magnet 140A may be formed so as to be disposed under the variable resistance element 100 to face a first surface of the variable resistance element 100, for example, a lower surface of the variable resistance element 100. In some implementations, the first permanent magnet 140A and the variable resistance element 100 are arranged along a first direction, for example, a vertical direction. The first magnet 140A generates magnetic field whose direction is opposite to the magnetization direction of the pinned layer 130 along an axis passing through the variable resistance element 100 (see, dotted arrows). As a result, an influence of a stray field generated by the pinned layer 130 can be offset or reduced by the magnetic field generated by the first permanent magnet 140A. On this account, when the pinned layer 130 has a downward magnetization direction as shown in the implementation of FIG. 2A, the first permanent magnet 140A is disposed such that a first surface of the first permanent magnet 140A facing the first surface, for example, an upper surface of the variable resistance element 100 has a north-seeking pole, and a second surface opposite to the first surface, for example, a lower surface, of the first permanent magnet 140A has a south-seeking pole. In another implementation, when the pinned layer 130 has an upward magnetization direction, the first permanent magnet 140A may be disposed so that a first surface of the first permanent magnet 140A facing the first surface of the variable resistance element 100, for example, an upper surface has a south-seeking pole, and a second surface, for example, a lower surface, opposite to the first surface of the first permanent magnet 140A has a north-seeking pole. In implementations, an insulating material for separating the first and second permanent magnets 140A and 140B from the variable resistance element 100 may be interposed between the variable resistance element and at least one of the first and second permanent magnets 140A and 140B or the variable resistance element 100.

The second permanent magnet 140B may be formed so as to be disposed over the variable resistance element 100 to face a second surface opposite to the first surface, for example, an upper surface of the variable resistance element 100. In some implementations, the second permanent magnet 140B and the variable resistance element 100 are arranged along the first direction, for example, the vertical direction. The second permanent magnet 140B generates a magnetic field whose direction is opposite to the magnetization direction of the pinned layer 130 along an axis passing through the variable resistance element 100 (see, dotted arrows). As a result, an influence of a stray field generated by the pinned layer 130 may be offset or reduced by the magnetic field generated by the second permanent magnet 140B. On this account, when the pinned layer 130 has a downward magnetization direction as in the implementation, the second permanent magnet 140B may be disposed so that a first surface of the second permanent magnet 140B facing the second surface of the variable resistance element 100, for example, a lower surface has a south-seeking pole, and a second surface of the second permanent magnet 140B, for example, an upper surface, opposite to the first surface of the second permanent magnet 140B has a north-seeking pole. Conversely, in another implementation, when the pinned layer 130 has an upward magnetization direction, a polarity of the first surface and a polarity of the second surface of the second permanent magnet 140B may be changed into each other. The first surface of the first permanent magnet 140A and the first surface of the second permanent magnet 140B that respectively face both surfaces of the variable resistance element 100 may have polarities opposite to each other.

When both of the first and second permanent magnets 140A and 140B exist, an influence of the magnetic fields by the first and second permanent magnets 140A and 140B may be strongest. However, occasionally, for example, when any one of the first and second permanent magnets 140A and 140B sufficiently offset the influence of the stray field of pinned layer 130, any one of the first and second permanent magnets 140A and 140B can be omitted.

The first and second permanent magnets 140A and 140B may include a material having perpendicular magnetic anisotropy, a material having in-plane magnetic anisotropy, or a material having no magnetic anisotropy. For example, the first and second permanent magnets 140A and 140B may include an alloy containing Fe, Ne or Co such as CoPt, FePt, FeNi, or others, or an alloy containing a rare earth metal such as Nd, Sm, or others.

As such, when the magnetic correction layer is omitted in the variable resistance element 100 and the first and second permanent magnets 140A and 140B are formed separately from the variable resistance element 100, it is possible to secure switching characteristics of the variable resistance element 100 and improve processes for forming the variable resistance element 100. For example, it is possible to reduce time and cost of the deposition process and facilitate the etch process. Further, since the first and second permanent magnets 140A and 140B are not integrated with layers in the variable resistance element 100 and thus their geometries are not limited by to an etching process like the magnetic correction layer 14 in the design in FIG. 1 the first and second permanent magnets 140A and 140B can be designed with a desired shape or geometry to produce a desired correction magnetic field in the variable resistance element 100, e.g., producing a uniform magnetic field or other desired correction magnetic field profile at the variable resistance element 100. As a result, the first and second permanent magnets 140A and 140B can be shaped and positioned to effectively to offset a leakage magnetic field generated by the pinned layer 130 at the free layer 110, thus improving the MTJ performance.

FIG. 2A shows an example where one variable resistance element 100 is disposed between the first permanent magnet 140A and the second permanent magnet 140B. In other implementations, a plurality of variable resistance elements 100 may be disposed between the first permanent magnet 140A and the second permanent magnet 140B. One such example is described in detail with reference to FIG. 2B.

Referring to FIG. 2B, a plurality of variable resistance elements 100 may be disposed between a first permanent magnet 140A and a second permanent magnet 140B. In this case, the first and second permanent magnets 140A and 140B may function as a magnetic correction layer to all of the plurality of variable resistance elements 100.

The plurality of variable resistance elements 100 may have the same structure as one another. That is, each of the plurality of variable resistance elements 100 may include an MTJ structure including a free layer 110, a pinned layer 130 and a tunnel barrier layer 120, and specifically, magnetization directions of the pinned layers 130 may be the same as one another.

Also, the plurality of variable resistance elements 100 may be disposed at substantially the same level in a first direction that is perpendicular to the layers in the variable resistance elements 100. The example illustrated shows a distance D2 between each of the plurality of variable resistance elements 100 and the first permanent magnet 140A and/or a distance D3 between each of the plurality of variable resistance elements 100 and the second permanent magnet 140B may be substantially constant. In some implementations, the first permanent magnet 140A and/or the second permanent magnet 140B may uniformly influence on the plurality of variable resistance elements 100. For reference, the distance D2 and the distance D3 may be the same in some applications. In other applications, however, the variable resistance element 100 may be disposed at an intermediate location between the first permanent magnet 140A and the second permanent magnet 140B in the first direction with different distances D2 and D3. When both of the first permanent magnet 140A and the second permanent magnet 140B are provided on the opposite sides of a variable resistance element 100, the distances D1, D2 and D3 can be used to determine the strengths of magnetic fields generated by the first and second permanent magnets 140A and 140B at the variable resistance element 100 for offsetting or reducing the influence from the stray field generated by the pinned layer 130.

In some implementations, a first surface of the first permanent magnet 140A may have a size that covers all of first surfaces of the plurality of variable resistance elements 100 and a first surface of the second permanent magnet 140B may have a size that covers all of second surfaces of the plurality of variable resistance elements 100.

In the specific examples of FIGS. 2A and 2B, a strength of the total magnetic field applied by the permanent magnets 140A and 140B to the variable resistance element 100, specifically, the magnetic field at the free layer 110, may vary depending on the distance D1 between the first permanent magnet 140A and the second permanent magnet 140B, the distance D2 between the first permanent magnet 140A and the variable resistance element 100, and/or the distance D3 between the second permanent magnet 140B and the variable resistance element 100. As the distances D1, D2 and D3 are decreased, the strength of the magnetic field applied to the free layer 110 may be increased. If the distances D1, D2 and D3 are decreased to a predetermined critical value, a magnetization direction of the free layer 110 may become the same as directions of the magnetic fields generated by the first and second permanent magnets 140A and 140B along an axis passing through the variable resistance element 100. Accordingly, in some implementations, an adjustable device may be provided to adjust the relative distance between a MTJ and the permanent magnetic device to adjust the magnetic field strength produced by the permanent magnetic device at the MTJ. Under this design, the magnetization direction of the free layer 110 may be opposite to a direction of the pinned layer 130, and as a result, a reset operation in which the variable resistance element 100 is changed into a high resistance state from a low resistance state can be performed by the presence of the magnetic field with a sufficiently high field magnitude by the first and second permanent magnets 240A and 240B. When the plurality of variable resistance elements 100 exist as shown in FIG. 2B, the plurality of variable resistance elements 100 may be reset at one time by decreasing the distances D1, D2 and D3. That is, it is possible to initialize the variable resistance element 100 by adjusting the positions of the first and second permanent magnets 240A and 240B to increase the magnetic field produced by them at the free layer with a sufficiently high field magnitude.

For the reset operation and/or the initialization operation of the variable resistance element 100 described above, an insulating material having elasticity may be used as an insulating material between the variable resistance element 1000 and the first permanent magnet 140A and/or second permanent magnet 140B. This insulating material may be or include a material which contracts when physical pressure is applied but recovers its original size and shape when the physical pressure is removed. In order to perform the reset operation to the variable resistance element 100 including all of the plurality of variable resistance elements 100, upward pressure may be applied to a lower surface of the first permanent magnet 140A and downward pressure may be applied to an upper surface of the second permanent magnet 140B. In this case, the insulating material between the first permanent magnet 140A and the variable resistance element 100, and the insulating material between the second permanent magnet 140B and the variable resistance element 100 may contract and the distances D1, D2 and D3 may be decreased so as to perform the reset operation. If the pressure applied to the first and second permanent magnets 140A and 140B is removed, the distances D1, D2 and D3 may be increased. The reset state of the variable resistance element 100, however, may be maintained as long as a voltage or current required to perform a set operation for changing the variable resistance element 100 into a low resistance state is not applied to the variable resistance element 100.

As a result, the physical force applied to the first and second permanent magnets 140A and 140B may facilitate the reset operation and/or the initialization operation.

In some implementations, the first and second permanent magnets 140A and 140B may be inserted during a process for packaging a semiconductor chip. This will be described below in detail with reference to FIGS. 3 to 7.

Figure 3A:
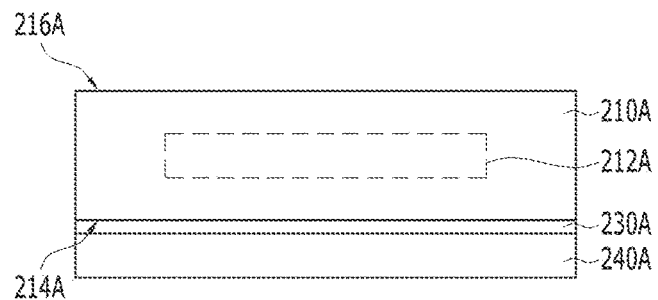
FIG. 3A is a cross-sectional view describing a portion of a semiconductor chip package in accordance with an implementation of the present disclosure.
Figure 3B:
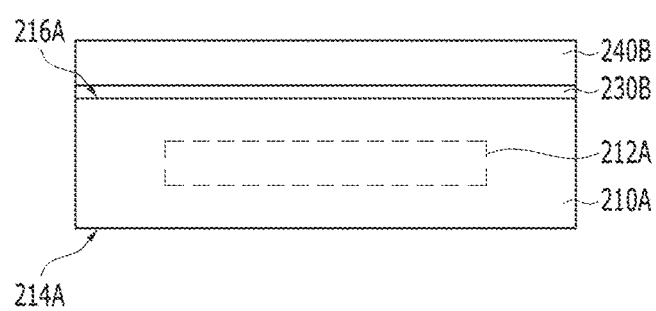
FIG. 3B is a cross-sectional view describing a portion of a semiconductor chip package in accordance with another implementation of the present disclosure.
Figure 3C:
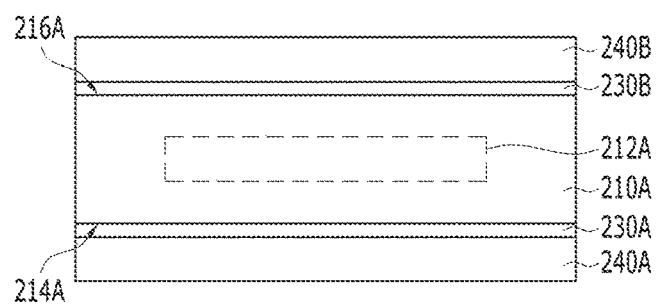
FIG. 3C is a cross-sectional view describing a portion of a semiconductor chip package in accordance with still another implementation of the present disclosure.

FIG. 3A is a cross-sectional view describing a portion of a semiconductor chip package in accordance with an implementation of the present disclosure, FIG. 3B is a cross-sectional view describing a portion of a semiconductor chip package in accordance with another implementation of the present disclosure, and FIG. 3C is a cross-sectional view describing a portion of a semiconductor chip package in accordance with still another implementation of the present disclosure.

Referring to FIG. 3A, the semiconductor chip package in accordance with the implementation of the present disclosure may include a semiconductor chip 210A and a first permanent magnet 240A that is attached to a first surface 214A, for example a lower surface of the semiconductor chip 210A, with a first adhesion member 230A interposed between the semiconductor chip 210A and the first permanent magnet 240A.

The semiconductor chip 210A may include a memory cell array 212A in which a plurality of memory cells are arranged, and in addition, further include various elements such as a peripheral circuit for driving the memory cell array 212A, etc.

Here, the memory cell array 212A may include the variable resistance element 100 described above as a memory cell, and further include an access device for driving the memory cell, lines, or others. The specific structure of the memory cell array 212A will be exemplarily described later with reference to FIGS. 4A and 4B.

The first surface 214A of the semiconductor chip 210A may be planarized by a polishing process such as a grinding process, etc. The first permanent magnet 240A may be attached to the planarized first surface 214A of the semiconductor chip 210A directly or with the first adhesion member 230A interposed between the first permanent magnet 240A and the first surface 214A of the semiconductor chip 210A.

The first permanent magnet 240A may substantially correspond to the first permanent magnet 140A of FIGS. 2A and 2B to provide a correction magnetic field at the variable resistance element 100 that offsets or reduces the undesired influence of a magnetic field produced by the pinned layer. The correction magnetic field produced by the first permanent magnet 240A may be, in some implementations, for example, a uniform magnetic field to the plurality of variable resistance elements included in the memory cell array 212A and the direction of the correction magnetic field generated by the first permanent magnet 240A may be opposite to a magnetization direction of a pinned layer of the variable resistance element included in the memory cell array 212A.

The example in FIG. 3A includes a first adhesion member 230A that engages the permanent magnet 240A relative to the memory cell array 212A at a desired position. In other implementations, the permanent magnet 240A may be engaged relative to the memory cell array 212A at a desired position without using the first adhesion member 230A. The first adhesion member 230A may include various materials having an adhesion property. For example, the first adhesion member 230A may be or include a penetrate wafer backside lamination (PWBL) tape. Further, the first adhesion member 230A may have elasticity so as to contract or stretch by pressure. Accordingly, when a upward pressure is applied to a lower surface of the first permanent magnet 240A, a thickness of the first adhesion member 230A may be decreased and a distance between the first permanent magnet 240A and the variable resistance element of the memory cell circuit 212A may be also decreased so that all of the variable resistance elements included in the memory cell circuit 212A can be reset at one time. In this example, the elasticity of the first adhesion member 230A provides a mechanism for adjusting the distance of the first permanent magnet 240A and thus adjusting the magnetic field strength at a variable resistance element in the memory device.

A stacked structure of the semiconductor chip 210A, the first adhesion member 230A and the first permanent magnet 240A may be mounted on a package substrate and molded with a predetermined molding member so as to form a semiconductor chip package. Accordingly, the first permanent magnet 240A may be inserted during a process for forming the semiconductor chip package, for example, after grounding the semiconductor chip 210A.

Referring to FIG. 3B, contrary to FIG. 3A, a second permanent magnet 240B may be attached to a second surface 216A, for example an upper surface of a semiconductor chip 210A. For this purpose, the second surface 216A of the semiconductor chip 210A may be planarized by a polishing process such as a grinding process. The second permanent magnet 240B may substantially correspond to the second permanent magnet 140B of FIGS. 2A and 2B. That is, the second permanent magnet 240B may function as a magnetic correction layer by applying a uniform magnetic field to the plurality of variable resistance elements included in the memory cell array 212A. A direction of a magnetic field generated by the second permanent magnet 240B may be opposite to a magnetization direction of a pinned layer of the variable resistance element included in the memory cell array 212A.

A second adhesion member 230B may be interposed between the semiconductor chip 210A and the second permanent magnet 240B. The second adhesion member 230B may have an adhesion property and elasticity so as to contract or stretch by physical pressure applied to the second permanent magnet 240B. This provides a mechanism for adjusting the relative position of the second permanent magnet 240B and thus the magnetic field strength at a variable resistance element in the memory device. Specifically, when a downward pressure is applied to an upper surface of the second permanent magnet 240B, a thickness of the second adhesion member 230B may be decreased and a distance between the second permanent magnet 240B and the variable resistance element of the memory cell circuit 212A may be also decreased so that all of the variable resistance elements included in the memory cell circuit 212A may be reset by the presence of the magnetic field with a sufficiently high field magnitude by the second permanent magnet 240B at one time.

Referring to FIG. 3C, a first permanent magnet 240A and a second permanent magnet 240B may be attached to a first surface 214A and a second surface 216A of a semiconductor chip 210A, respectively. For this purpose, the first surface 214A and the second surface 216A of the semiconductor chip 210A may be planarized by a polishing process such as a grinding process. Each of the first and second permanent magnets 240A and 240B may substantially correspond to the first and second permanent magnets 140A and 140B of FIGS. 2A and 2B, respectively. The first and second permanent magnets 240A and 240B may function as a magnetic correction layer by applying a uniform magnetic field to the plurality of variable resistance elements included in the memory cell array 212A. Directions of the magnetic fields generated by the first and second permanent magnets 240A and 240B may be opposite to a magnetization direction of a pinned layer of the variable resistance element included in the memory cell array 212A. Here, a surface of the first permanent magnet 240A facing the semiconductor chip 210A, for example, an upper surface of the first permanent magnet 240A, may have a different polarity from that of a surface of the second permanent magnet 240B facing the semiconductor chip 210A, for example, a lower surface of the second permanent magnet 240B. For example, when the polarity of the upper surface of the first permanent magnet 240A is a north-seeking pole, the polarity of the lower surface of the second permanent magnet 240B may be a south-seeking pole. As such, it is possible to form a magnetic field in one direction on an axis passing through the memory cell circuit 212A.

A first adhesion member 230A may be interposed between the semiconductor chip 210A and the first permanent magnet 240A, and a second adhesion member 230B may be interposed between the semiconductor chip 210A and the second permanent magnet 240B. The first and second adhesion members 230A and 230B may have an adhesion property and elasticity so as to contract or stretch by physical pressure applied to the first and second permanent magnets 240A and 240B. Here, when upward pressure is applied to a lower surface of the first permanent magnet 240A and downward pressure is applied to an upper surface of the second permanent magnet 240B, thicknesses of the first and second adhesion members 230A and 230B may be decreased and a distance between the first and second permanent magnets 240A and 240B and the variable resistance element of the memory cell circuit 212A so that all of the variable resistance elements included in the memory cell circuit 212A may be reset at one time.

Figure 4A:
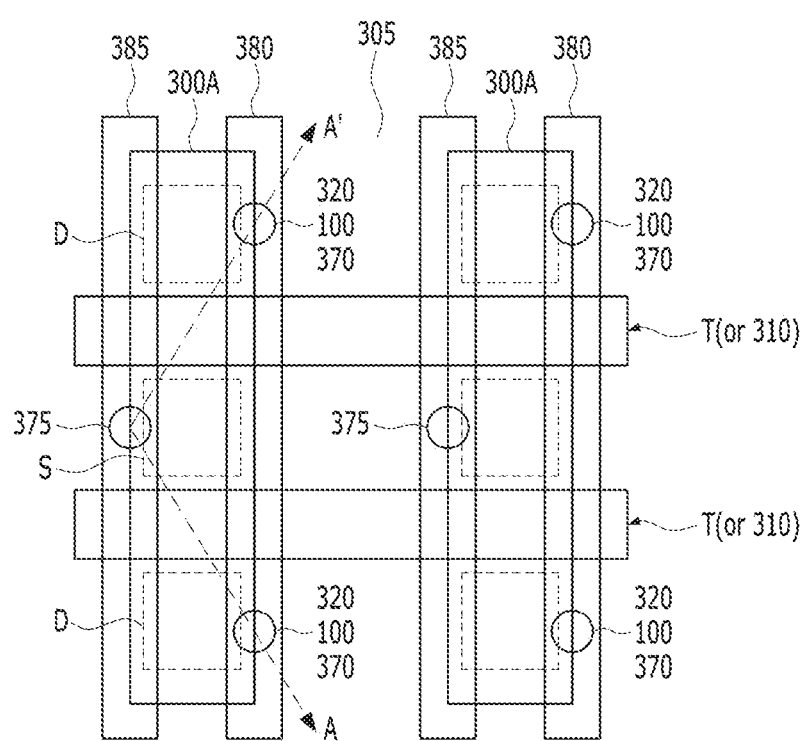
FIGS. 4A and 4B are cross-sectional views describing an example of a memory cell array of FIGS. 3A to 3C.
Figure 4B:
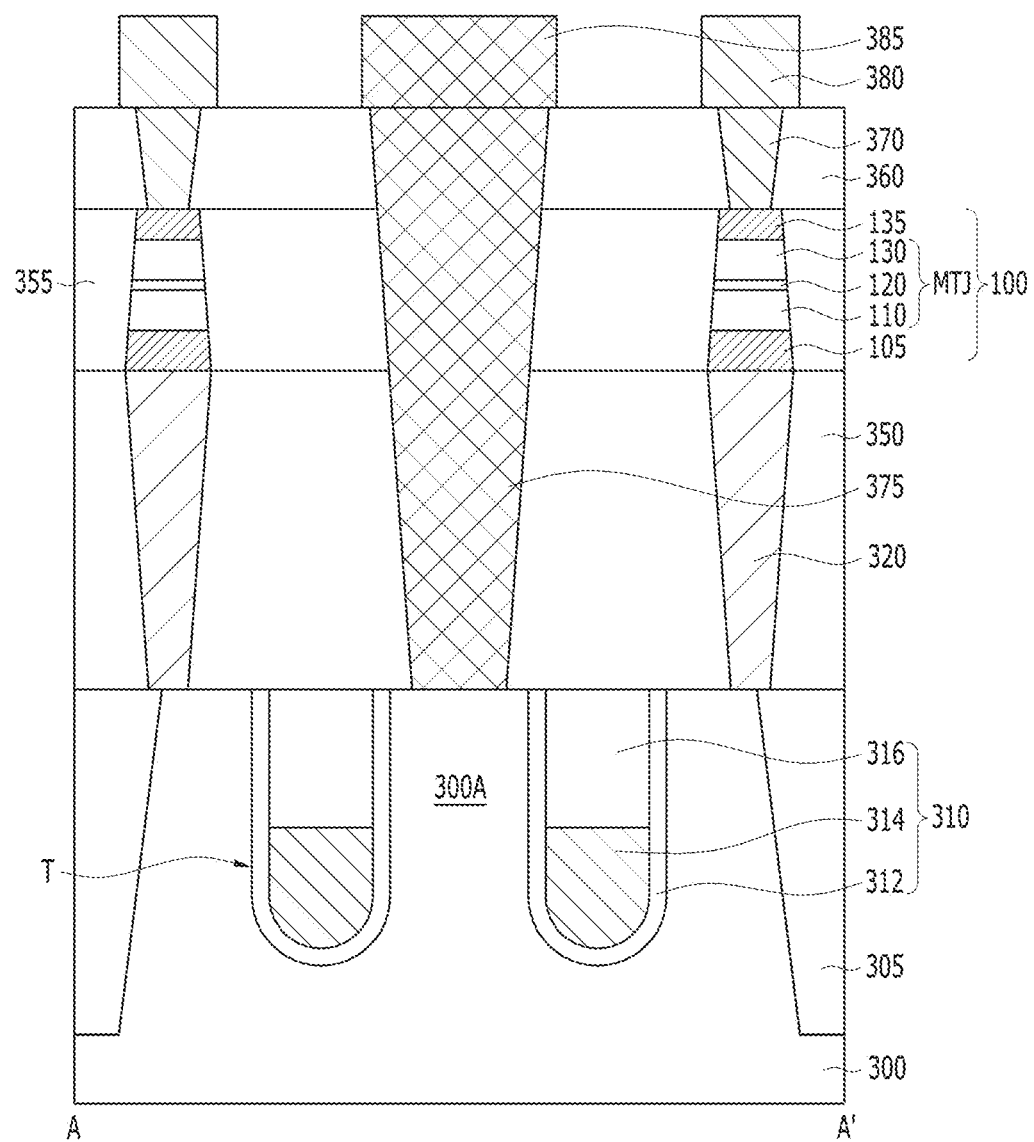

FIGS. 4A and 4B are cross-sectional views describing an example of a memory cell array of FIGS. 3A to 3C. FIG. 4A is a plane view and FIG. 4B is a cross-sectional view taken along a line A-A' of FIG. 4A.

Referring to FIGS. 4A and 4B, the memory cell of the implementation of the present disclosure may include a transistor including a gate structure 310 formed over a substrate 300 and including a gate dielectric layer 312, a gate electrode 314 and a gate protective layer 316, and a source region S and a drain region D formed in active regions 300A on both sides of the gate structure 310, a lower contact plug 320 couple to each of the drain regions D of the transistor, a stacked structure of a variable resistance element 100 and an upper contact plug 370, a source line contact plug 375 coupled to each of the source regions S of the transistor, a bit line 380 disposed over the upper contact plug 370 and coupled to the upper contact plug 370, and a source line 385 disposed over the source line contact plug 375 and coupled to the source line contact plug 375.

The active region 300A may be defined by a device isolation layer 305 formed in the semiconductor substrate 300, and extend in a direction, for example, a vertical direction. The plurality of active regions 300A may be arranged in a direction crossing the extended direction, for example, a horizontal direction. The bit line 380 and the source line 385 may extend in substantially the same direction as the active region 300A. The gate structure 310 may extend in a direction across the active region 300A.

Reference numbers 350, 355 and 360 which have not been explained may be referred to as interlayer dielectric layers.

The variable resistance element 100 may include an MTJ structure including a free layer 110, a tunnel barrier layer 120 and a pinned layer 130, and in addition, further include layers for improving characteristics and processes of the MTJ structure. One or more layers disposed under the MTJ structure is referred to as an under layer 105 and one or more layers disposed over the MTJ structure may be referred to as an upper layer 135. The under layer 105 may have a single-layer structure or a multi-layer structure including a conductive material and function as a seed layer for helping a crystal growth of the free layer 110, a lower electrode disposed in a lowermost portion of the variable resistance element 100 and coupled to the lower contact plug 320, etc. The upper layer 135 may have a single-layer structure or a multi-layer structure including a conductive material and function as a hard mask layer used as an etch barrier during an etch process for forming the variable resistance element 100 and an upper electrode disposed in an uppermost portion of the variable resistance element 100 and coupled to the upper contact plug 370.

The variable resistance element 100 may store data by switching between different resistance states by applying a voltage or current of a sufficient magnitude to the variable resistance element 100 through the bit line 380 and the source line 385. Here, the variable resistance element 100 does not include a magnetic correction layer. However, since a permanent magnet although not shown in FIGS. 4A and 4B may function as the magnetic correction layer, it is possible to secure switching characteristics of the variable resistance element 100.

Meanwhile, the two or more semiconductor chip 210A of FIGS. 3A to 3C may be stacked. This will be exemplarily described with reference to FIG. 5.

Figure 5:
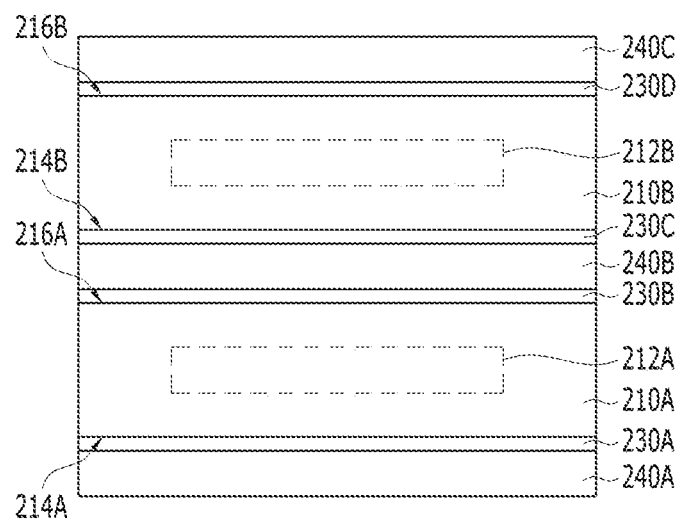
FIG. 5 is a cross-sectional view describing a portion of a semiconductor chip package in accordance with further another implementation of the present disclosure.

FIG. 5 is a cross-sectional view describing a portion of a semiconductor chip package in accordance with further another implementation of the present disclosure.

Referring to FIG. 5, the semiconductor chip package in accordance with the implementation of the present disclosure may include two semiconductor chips 210A and 210B which are stacked. In a stack direction, the lower semiconductor chip 210A in a stack direction may be referred to as a first semiconductor chip 210A and the upper semiconductor chip 210A may be referred to as a second semiconductor chip 210B.

A first permanent magnet 240A may be attached to a first surface 214A, for example, a lower surface of the first semiconductor chip 210A with a first adhesion member 230A interposed between the first permanent magnet 240A and the first semiconductor chip 210A, and a second permanent magnet 240B may be attached to a second surface 216A, for example, an upper surface, opposite to the first surface 214A with a second adhesion member 230B interposed between the second permanent magnet 240B and the first semiconductor chip 210A.

Here, the second permanent magnet 240B may be attached to a first surface 214B, for example, a lower surface of the second semiconductor chip 210B with a third adhesion member 230C interposed between the second permanent magnet 240B and the second semiconductor chip 210B. That is, the second permanent magnet 240B may apply a magnetic field to the first semiconductor chip 210A and the second semiconductor chip 210B at the same time.

A third permanent magnet 240c may be attached to a second surface 216B, for example, an upper surface, opposite to the first surface 214B of the second semiconductor chip 210B with a fourth adhesion member 230D interposed between the third permanent magnet 240C and the second semiconductor chip 210B.

The plurality of semiconductor chips may be stacked along one direction in the above manner. One permanent magnet may be interposed between the two semiconductor chips which are adjacent to each other in a stack direction so as to apply a magnetic field to the two semiconductor chips at the same time.

A stack structure of the first semiconductor chip 210A, the first adhesion member 230A, the first permanent magnet 240A, the second adhesion member 230B, the second permanent magnet 240B, the third adhesion member 230C, the second semiconductor chip 210B, the fourth adhesion member 230D and the third permanent magnet 240C may be mounted over a package substrate and molded with a predetermined molding member so as to form a semiconductor chip package. That is, the first to third permanent magnets 240A, 240B and 240C may be inserted during the process for forming the semiconductor chip package, for example, during the stacking process after the grounding process of the semiconductor chips 210A and 210B.

In the implementations of FIGS. 3A to 3C or FIG. 5, the permanent magnet may be attached to the semiconductor chip after grounding of the semiconductor chip. However, another implementation is also possible. For example, the permanent magnet may be attached to the molding member during molding the semiconductor instead of the semiconductor chip. This will be exemplarily described with reference to FIG. 6.

Figure 6:
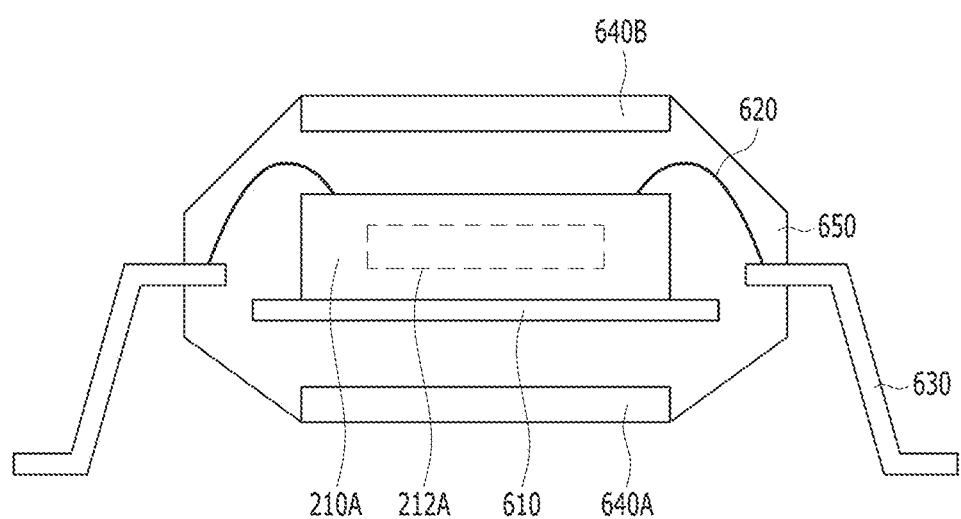
FIG. 6 is a cross-sectional view describing a semiconductor package in accordance with an implementation of the present disclosure.

FIG. 6 is a cross-sectional view describing a semiconductor package in accordance with an implementation of the present disclosure.

Referring to FIG. 6, the semiconductor package in accordance with the implementation of the present disclosure may include a semiconductor chip 210A mounted over a package substrate 610 including a memory cell array 212A, a wire 620 for electrically coupling the semiconductor chip 210A to a lead frame 630, a molding member 650 surrounding the semiconductor chip 210A, the wire 620 and a portion of the lead frame 630 and enabling a remaining portion of the lead frame 630 to be withdrawn outwardly, a first permanent magnet 640A formed under the molding member 650 and a second permanent magnet 640B formed over the molding member 650.

The semiconductor chip 210A may be substantially the same as the semiconductor chip 210A of the above implementations, and be attached to one surface of the substrate 610 with an adhesion member (not shown) interposed therebetween. A bonding pad (not shown) may be formed on an upper surface of the semiconductor chip 210A and be bonded to the wire 620.

Each of the first and second permanent magnets 640A and 640B may substantially correspond to the first and second permanent magnets 140A and 140B of FIGS. 2A and 2B, respectively. However, the first and second permanent magnets 640A and 640B may be attached not to the semiconductor chip 210A but to the molding member 650. That is, the first and second permanent magnets 640A and 640B may be spaced from the semiconductor chip 210A with the molding member 650 therebetween.

The molding member 650 may include an insulating material capable of sealing, for example, an Epoxy Molding Compound (EMC), etc. Further, the molding member 650 may include an insulating material having elasticity. This insulating material may be or include a material which contracts when physical pressure is applied, however, recovers its original size and shape when the physical pressure is removed. In order to perform a reset operation to the variable resistance element included in the memory cell array 212A including all of the plurality of variable resistance elements, a upward pressure may be applied to a lower surface of the first permanent magnet 640A and downward pressure may be applied to an upper surface of the second permanent magnet 640B. In this case, the molding member 650 between the first permanent magnet 640A and the semiconductor chip 210A, and the molding member 650 between the second permanent magnet 640B and the semiconductor chip 210A may contract so as to perform a reset operation to the variable resistance element.

The above and other memory circuits or semiconductor devices based on the disclosed technology can be used in a range of devices or systems. FIGS. 7-11 provide some examples of devices or systems that can implement the memory circuits disclosed herein.

Figure 7:
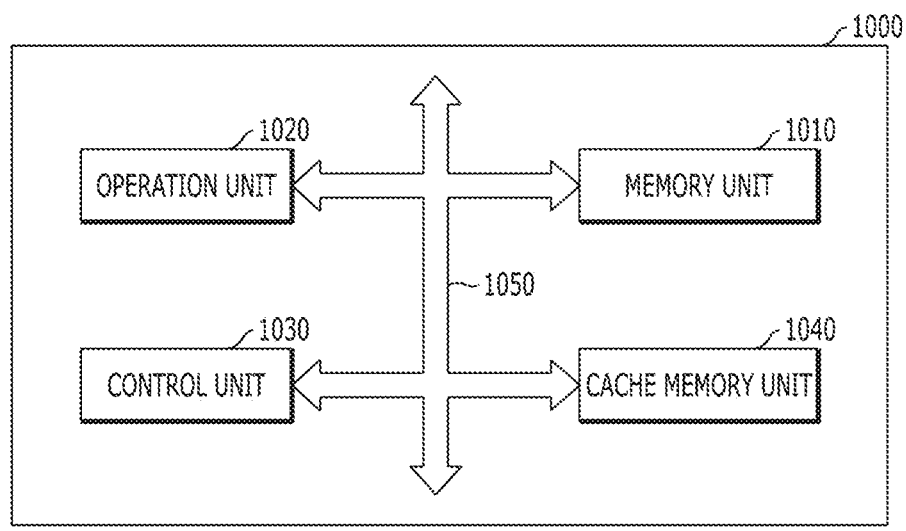
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element including a Magnetic Tunnel Junction (MTJ) structure including a free layer having a changeable magnetization direction, a pinned layer having a fixed magnetization direction and a tunnel barrier layer interposed between the free layer and the pinned layer; and a first permanent magnet having a first surface facing a first surface of the variable resistance element and spaced from the variable resistance element, in a first direction in which the free layer, the tunnel barrier layer and the pinned layer are arranged, wherein a magnetic field generated by the first permanent magnet has a direction which offsets or reduces an influence of a stray field generated by the pinned layer. Through this, data storage characteristics and operating characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
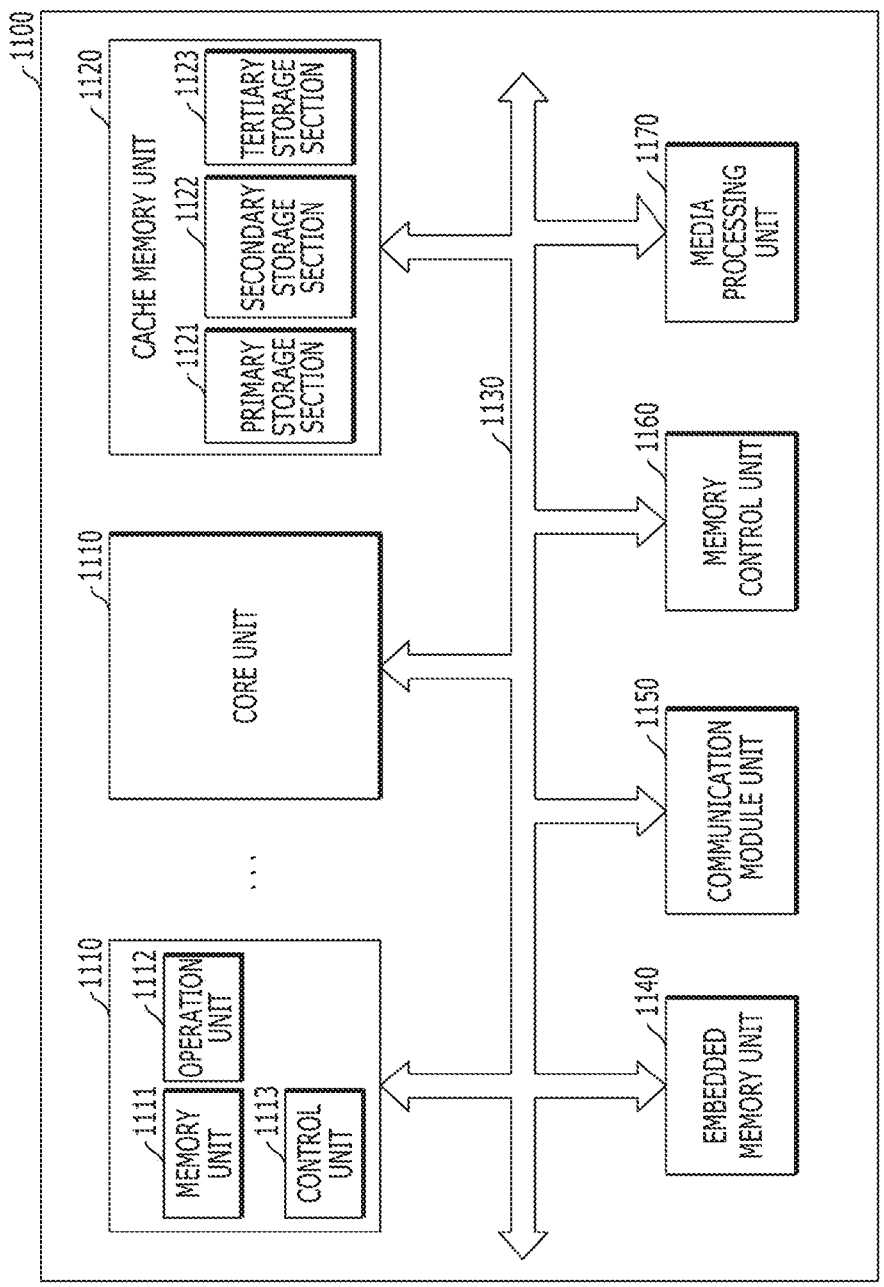
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element including a Magnetic Tunnel Junction (MTJ) structure including a free layer having a changeable magnetization direction, a pinned layer having a fixed magnetization direction and a tunnel barrier layer interposed between the free layer and the pinned layer; and a first permanent magnet having a first surface facing a first surface of the variable resistance element and spaced from the variable resistance element, in a first direction in which the free layer, the tunnel barrier layer and the pinned layer are arranged, wherein a magnetic field generated by the first permanent magnet has a direction which offsets or reduces an influence of a stray field generated by the pinned layer. Through this, data storage characteristics and operating characteristics of the cache memory unit 1120 may be improved. As a consequence, operating characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units

1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
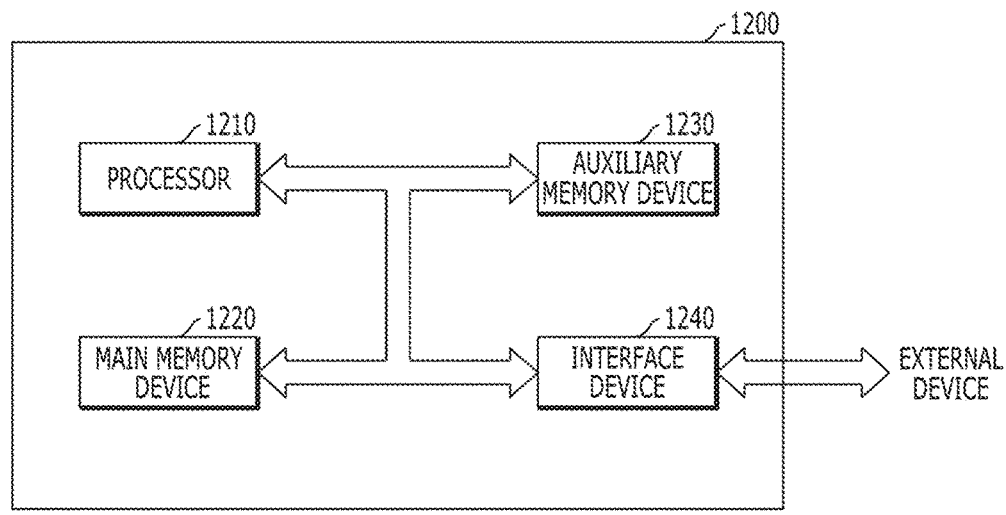
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element including a Magnetic Tunnel Junction (MTJ) structure including a free layer having a changeable magnetization direction, a pinned layer having a fixed magnetization direction and a tunnel barrier layer interposed between the free layer and the pinned layer; and a first permanent magnet having a first surface facing a first surface of the variable resistance element and spaced from the variable resistance element, in a first direction in which the free layer, the tunnel barrier layer and the pinned layer are arranged, wherein a magnetic field generated by the first permanent magnet has a direction which offsets or reduces an influence of a stray field generated by the pinned layer. Through this, data storage characteristics and operating characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element including a Magnetic Tunnel Junction (MTJ) structure including a free layer having a changeable magnetization direction, a pinned layer having a fixed magnetization direction and a tunnel barrier layer interposed between the free layer and the pinned layer; and a first permanent magnet having a first surface facing a first surface of the variable resistance element and spaced from the variable resistance element, in a first direction in which the free layer, the tunnel barrier layer and the pinned layer are arranged, wherein a magnetic field generated by the first permanent magnet has a direction which offsets or reduces an influence of a stray field generated by the pinned layer. Through this, data storage characteristics and operating characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
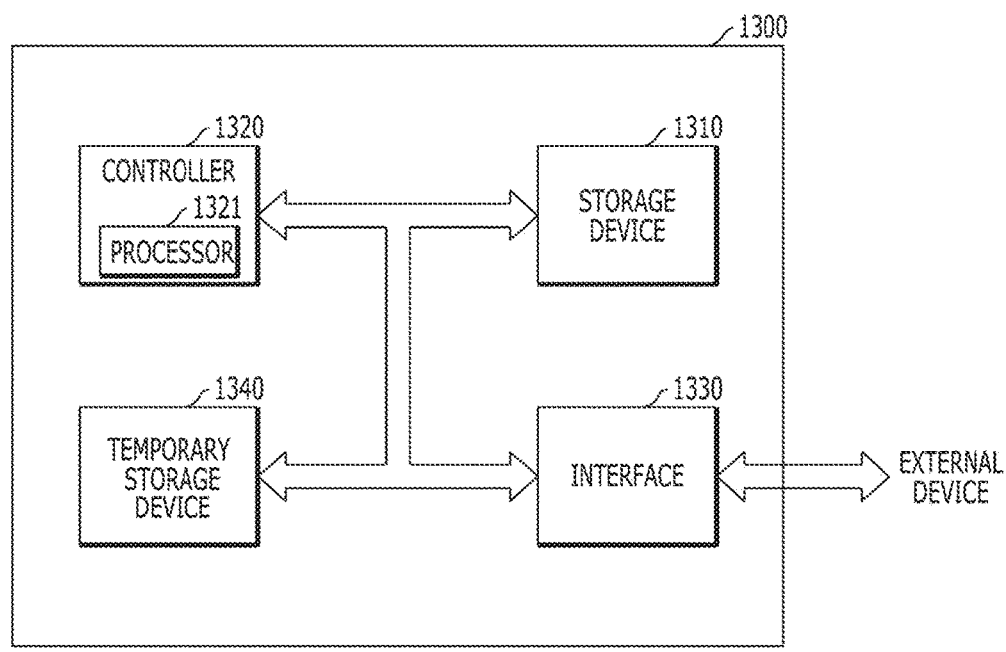
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element including a Magnetic Tunnel Junction (MTJ) structure including a free layer having a changeable magnetization direction, a pinned layer having a fixed magnetization direction and a tunnel barrier layer interposed between the free layer and the pinned layer; and a first permanent magnet having a first surface facing a first surface of the variable resistance element and spaced from the variable resistance element, in a first direction in which the free layer, the tunnel barrier layer and the pinned layer are arranged, wherein a magnetic field generated by the first permanent magnet has a direction which offsets or reduces an influence of a stray field generated by the pinned layer. Through this, data storage characteristics and operating characteristics of the storage device 1310 or the temporary storage device 1340 may be improved. As a consequence, operating characteristics and data storage characteristics of the data storage system 1300 may be improved.

Figure 11:
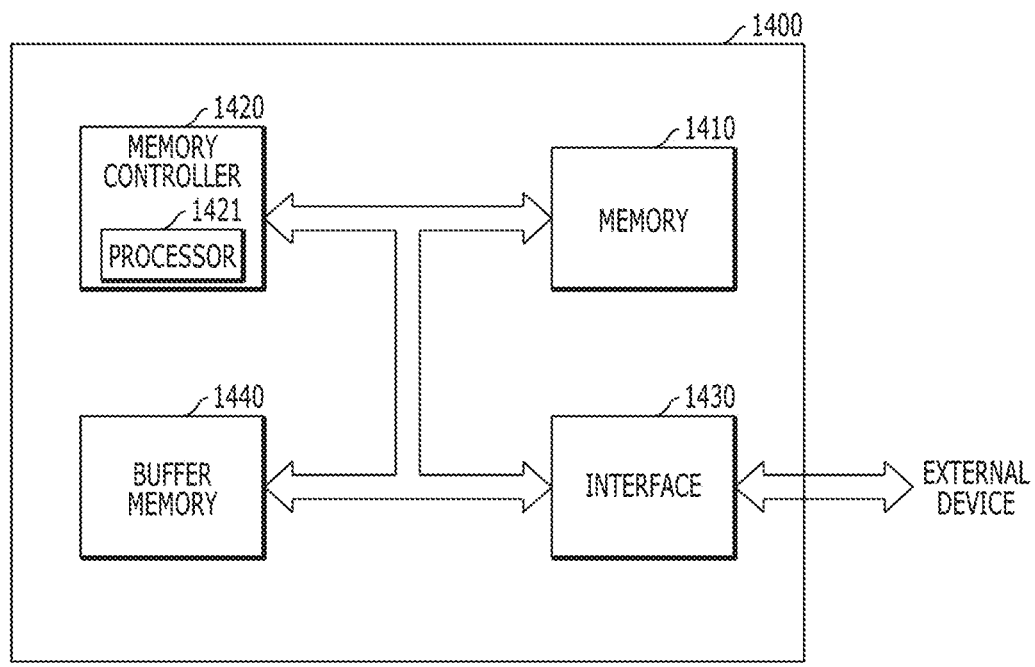
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance element including a Magnetic Tunnel Junction (MTJ) structure including a free layer having a changeable magnetization direction, a pinned layer having a fixed magnetization direction and a tunnel barrier layer interposed between the free layer and the pinned layer; and a first permanent magnet having a first surface facing a first surface of the variable resistance element and spaced from the variable resistance element, in a first direction in which the free layer, the tunnel barrier layer and the pinned layer are arranged, wherein a magnetic field generated by the first permanent magnet has a direction which offsets or reduces an influence of a stray field generated by the pinned layer. Through this, data storage characteristics and operating characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element including a Magnetic Tunnel Junction (MTJ) structure including a free layer having a changeable magnetization direction, a pinned layer having a fixed magnetization direction and a tunnel barrier layer interposed between the free layer and the pinned layer; and a first permanent magnet having a first surface facing a first surface of the variable resistance element and spaced from the variable resistance element, in a first direction in which the free layer, the tunnel barrier layer and the pinned layer are arranged, wherein a magnetic field generated by the first permanent magnet has a direction which offsets or reduces an influence of a stray field generated by the pinned layer. Through this, data storage characteristics and operating characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor chip package,
    wherein the semiconductor chip package comprises:
    a semiconductor chip having a memory cell array; and
    a first permanent magnet having a first surface facing a first surface of the semiconductor chip,
    wherein the memory cell array comprises a variable resistance element including a Magnetic Tunnel Junction (MTJ) structure including a free layer having a changeable magnetization direction, a pinned layer having a fixed magnetization direction and a tunnel barrier layer interposed between the free layer and the pinned layer, and
    the first permanent magnet generates a magnetic field having a magnetization direction to offset or reduce an influence of a stray field generated by the pinned layer,
    wherein the semiconductor chip package further comprises a molding member at least partially surrounding the semiconductor chip, and
    the molding member has elasticity and is interposed between the semiconductor chip and the first permanent magnet.

2. The electronic device according to claim 1, wherein the first permanent magnet is directly attached to the first surface of the semiconductor chip.

3. The electronic device according to claim 1, wherein the semiconductor chip package further comprises a first adhesion member interposed between the semiconductor chip and the first permanent magnet.

4. The electronic device according to claim 3, wherein the first adhesion member has elasticity.

5. The electronic device according to claim 1, wherein, the magnetization direction of the magnetic field generated by the first permanent magnet is opposite to the magnetization direction of the pinned layer.

6. The electronic device according to claim 1, wherein the semiconductor chip package further comprises a second permanent magnet having a first surface facing a second surface opposite to the first surface of the semiconductor chip, and
    the second permanent magnet generates a magnetic field having a magnetization direction to offset or reduce the influence of the stray field generated by the pinned layer.

7. The electronic device according to claim 6, wherein the second permanent magnet is directly attached to the second surface of the semiconductor chip.

8. The electronic device according to claim 6, wherein the semiconductor chip package further comprises a second adhesion member interposed between the semiconductor chip and the second permanent magnet.

9. The electronic device according to claim 8, wherein the second adhesion member has elasticity.

10. The electronic device according to claim 6, wherein the semiconductor chip package further comprises a molding member at least surrounding the semiconductor chip, and
    the molding member has elasticity and is interposed between the semiconductor chip and the first permanent magnet, and between the semiconductor chip and the second permanent magnet.

11. The electronic device according to claim 6, wherein the magnetization directions of the magnetic fields generated by the first and second permanent magnets are opposite to the magnetization direction of the pinned layer.

12. The electronic device according to claim 1, wherein the semiconductor chip package further comprises an additional semiconductor chip facing a second surface opposite to the first surface of the first permanent magnet, and
    the additional semiconductor chip includes a pinned layer having a different magnetization direction from the magnetization direction of the magnetic field generated by the first permanent magnet.

13. An electronic device comprising a semiconductor chip package,
    wherein the semiconductor chip package comprises:
    a semiconductor chip having a memory cell array; and
    a first permanent magnet having a first surface facing a first surface of the semiconductor chip,
    wherein the memory cell array comprises a variable resistance element including a Magnetic Tunnel Junction (MTJ) structure including a free layer having a changeable magnetization direction, a pinned layer having a fixed magnetization direction and a tunnel barrier layer interposed between the free layer and the pinned layer, and
    the first permanent magnet generates a magnetic field having a magnetization direction to offset or reduce an influence of a stray field generated by the pinned layer, and
    the semiconductor chip package further comprises an additional semiconductor chip facing a second surface opposite to the first surface of the first permanent magnet, and the additional semiconductor chip includes a pinned layer having a different magnetization direction from the magnetization direction of the magnetic field generated by the first permanent magnet.

14. The electronic device according to claim 13, wherein the first permanent magnet is directly attached to the first surface of the semiconductor chip.

15. The electronic device according to claim 13, wherein the semiconductor chip package further comprises a first adhesion member interposed between the semiconductor chip and the first permanent magnet.

16. The electronic device according to claim 15, wherein the first adhesion member has elasticity.

17. The electronic device according to claim 15, wherein the first adhesion member is structured to contract or stretch to adjust a distance between the semiconductor chip and the first permanent magnet.

18. The electronic device according to claim 15, wherein the first adhesion member is structured to adjust the magnetic field generated by the first permanent magnet at the free layer of the MTJ structure.

19. The electronic device according to claim 13, wherein, the magnetization direction of the magnetic field generated by the first permanent magnet is opposite to the magnetization direction of the pinned layer of the additional semiconductor chip.

20. The electronic device according to claim 13, wherein the additional semiconductor chip is directly attached to the second surface of the first permanent magnet.

21. The electronic device according to claim 13, wherein the semiconductor chip package further comprises a second adhesion member interposed between the additional semiconductor chip and the first permanent magnet.

22. The electronic device according to claim 21, wherein the second adhesion member has elasticity.

23. The electronic device according to claim 21, wherein the second adhesion member is structured to contract or stretch to adjust a distance between the additional semiconductor chip and the first permanent magnet.

24. The electronic device according to claim 13, wherein the semiconductor chip package further comprises a molding member at least surrounding the semiconductor chip and the additional semiconductor chip, and the molding member has elasticity and is interposed between the semiconductor chip and the first permanent magnet, and between the additional semiconductor chip and the first permanent magnet.

25. The electronic device according to claim 13, wherein the semiconductor chip package further comprises a molding member at least surrounding the semiconductor chip and the additional semiconductor chip, the molding member is interposed between the semiconductor chip and the first permanent magnet, and between the additional semiconductor chip and the first permanent magnet, and the molding member is structured to adjust a distance between the semiconductor chip and the first permanent magnet and a distance between the additional semiconductor chip and the first permanent magnet.

* * * * *